United States Patent
Feng et al.

(10) Patent No.: US 12,517,406 B2
(45) Date of Patent: Jan. 6, 2026

(54) DISPLAY MODULE

(71) Applicants: Beijing BOE Sensor Technology Co., Ltd., Beijing (CN); BOE TECHNOLOGY GROUP CO., LTD., Beijing (CN)

(72) Inventors: Chunnan Feng, Beijing (CN); Chuncheng Che, Beijing (CN); Xiaojuan Wu, Beijing (CN); Yu Zhao, Beijing (CN); Zizheng Xie, Beijing (CN); Yeyu Feng, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 985 days.

(21) Appl. No.: 17/639,301

(22) PCT Filed: Apr. 27, 2021

(86) PCT No.: PCT/CN2021/090086
§ 371 (c)(1),
(2) Date: Nov. 3, 2022

(87) PCT Pub. No.: WO2022/226753
PCT Pub. Date: Nov. 3, 2022

(65) Prior Publication Data
US 2024/0045292 A1 Feb. 8, 2024

(51) Int. Cl.
*H01Q 1/38* (2006.01)
*G02F 1/1362* (2006.01)
(Continued)

(52) U.S. Cl.
CPC .. *G02F 1/136295* (2021.01); *G02F 1/136209* (2013.01); *H01Q 1/22* (2013.01);
(Continued)

(58) Field of Classification Search
CPC .................................. H01Q 1/22; H01Q 1/38
See application file for complete search history.

(56) References Cited

U.S. PATENT DOCUMENTS

2012/0299863 A1* 11/2012 Yilmaz ............ G06K 19/07758
345/174
2019/0220123 A1* 7/2019 Kanaya .................. H10K 59/40
(Continued)

FOREIGN PATENT DOCUMENTS

CN 110082976 A 8/2019
CN 110554526 A 12/2019
(Continued)

*Primary Examiner* — Awat M Salih
(74) *Attorney, Agent, or Firm* — HOUTTEMAN LAW LLC (57) ABSTRACT

Provided is a display module, which includes: a display substrate having a display region and a bonding region and including a first base, and a first trace disposed on the first base and extending from the display region to the bonding region; a flexible circuit board including a second base having a first surface and a second surface, a second trace and a third trace on the first surface, a fourth trace on the second surface; and a near field communication antenna. The first trace has a first end electrically connected to a first end of the second trace, and a second end electrically connected to a first end of the fourth trace; a second end of the fourth trace is connected to a first end of the third trace; when the flexible circuit board is folded, the first to fourth traces form a near field communication antenna.

19 Claims, 4 Drawing Sheets

(51) Int. Cl.
  *H01Q 1/22*    (2006.01)
  *H04W 4/80*    (2018.01)
  *H05K 1/18*    (2006.01)

(52) U.S. Cl.
  CPC ............... *H01Q 1/38* (2013.01); *H04W 4/80* (2018.02); *H05K 1/189* (2013.01); *H05K 2201/10136* (2013.01)

(56) References Cited

U.S. PATENT DOCUMENTS

| | | | |
|---|---|---|---|
| 2019/0372196 A1 | 12/2019 | Aso | |
| 2020/0365626 A1* | 11/2020 | Lin | ......................... H01Q 21/08 |
| 2021/0067937 A1 | 3/2021 | Kim et al. | |
| 2022/0384530 A1* | 12/2022 | Huang | ................. H10K 50/868 |
| 2022/0399661 A1* | 12/2022 | Zhou | ....................... H05K 1/189 |

FOREIGN PATENT DOCUMENTS

| | | |
|---|---|---|
| CN | 111258459 A | 6/2020 |
| CN | 111596481 A | 8/2020 |
| CN | 112462560 A | 3/2021 |

\* cited by examiner

DISPLAY MODULE

TECHNICAL FIELD

The present disclosure relates to the field of display technology, and particularly relates to a display module.

BACKGROUND

Near Field Communication (NFC) is a non-contact identification and interconnection technology that adopts a near field magnetic field communication mode, which has the characteristics of short transmission distance, low energy consumption, resistance to signal interference and the like, and can perform short-range wireless communication between mobile devices and consumer electronic products.

The NFC technology has been generally applied to data exchange on electronic devices, and to utilize the NFC communication technology, a communication antenna needs to be installed on an electronic device to transmit and receive electromagnetic wave signals, and the communication antenna will occupy a large space. Current electronic devices mostly utilize the NFC communication technology by providing an independent NFC communication module external to a mainboard of the electronic device, and thus a large space is occupied, which is unfavorable for a light-weight design of device.

SUMMARY

To solve at least one of the problems in the prior art, the present disclosure provides a display module.

An embodiment of the present disclosure provides a display module, including a display substrate, a flexible circuit board, and a near field communication antenna; where the display substrate has a display region and a bonding region; the flexible circuit board is bonded with and connected to the display substrate in the bonding region; at least part of a structure of the near field communication antenna is disposed in the display region of the display substrate and the flexible circuit board.

The display substrate includes a first base; the flexible circuit board includes a second base; the near field communication antenna includes a first trace and a second trace electrically connected, the first trace is disposed on the first base and extends from the display region to the bonding region, and the second trace is located on the second base.

The second base includes a first surface and a second surface disposed oppositely; the second trace is disposed on the first surface; and the near field communication antenna further includes a first lead terminal and a second lead terminal disposed on the flexible circuit board; and     a first end of the first trace is connected to a first end of the second trace; a second end of the first trace is connected to the first lead terminal; and a second end of the second trace serves as the second lead terminal.

The display substrate further includes a first connection pad and a second connection pad located in the bonding region and disposed on the first base; and a third connection pad and a fourth connection pad are disposed on the first surface of the second base;

the first connection pad is bonded with and connected to the third connection pad so that the first end of the first trace is electrically connected to the first end of the second trace; and     the second connection pad is bonded with and connected to the fourth connection pad so that the second end of the first trace is electrically connected to the first lead terminal.

In some implementations, a magnetic material layer is disposed on a side of the second trace away from the first surface; and the magnetic material layer covers the second trace.

In some implementations, the second base includes a first surface and a second surface disposed oppositely; the second trace includes a first sub-trace segment and a second sub-trace located on the first surface, and a third sub-trace segment located on the second surface; and the near field communication antenna further includes a first lead terminal and a second lead terminal disposed on the flexible circuit board; and     a first end of the first trace is connected to a first end of the first sub-trace segment; a second end of the first trace is connected to a first end of the third sub-trace segment through a first via penetrating through the second base; a second end of the third sub-trace segment is connected to a first end of the second sub-trace segment through a second via penetrating through the second base; a second end of the first sub-trace segment serves as the first lead terminal; and a second end of the second sub-trace segment serves as the second lead terminal.

In some implementations, the display substrate further includes a first connection pad and a second connection pad located in the bonding region and disposed on the first base; and a third connection pad and a fourth connection pad are disposed on the first surface of the second base;

the first connection pad is bonded with and connected to the third connection pad so that the first end of the first trace is electrically connected to the first end of the first sub-trace segment; and     the second connection pad is bonded with and connected to the fourth connection pad so that the second end of the first trace is electrically connected to the first end of the third sub-trace segment through the first via.

In some implementations, orthographic projections of the first sub-trace segment and the second sub-trace segment on the second base overlap an orthographic projection of the third sub-trace segment on the second base.

In some implementations, when the second base is disposed opposite to the first base, orthographic projections of the first sub-trace segment, the second sub-trace segment and the third sub-trace segment on the first base are located within a range defined by an orthographic projection of the first trace on the first base.

In some implementations, a magnetic material layer is disposed on a side of the first sub-trace segment and the second sub-trace segment away from the first surface; and the magnetic material layer covers the first sub-trace segment and the second sub-trace segment; and/or     a magnetic material layer is disposed on a side of the third sub-trace segment away from the first surface; and the magnetic material layer covers the third sub-trace segment.

In some implementations, the first lead terminal and the second lead terminal extend in a same direction.

In some implementations, the first trace has a metal grid structure.

In some implementations, the metal grid structure includes a plurality of first sub-metal lines and a plurality of second sub-metal lines which are intersected and electrically connected with each other; and the display substrate further includes a first metal layer and a second metal layer located on the first base, and an interlayer insulation layer located between the first metal layer and the second metal layer;

the first metal layer includes a plurality of gate lines and the plurality of first sub-metal lines, and each of the plurality of gate lines and each of the plurality of first sub-metal lines are spaced apart from each other;

the second metal layer includes a plurality of data lines and the plurality of second sub-metal lines, and each of the plurality of data lines and each of the plurality of second sub-metal lines are spaced apart from each other; and the first sub-metal lines and the second sub-metal lines are electrically connected at the intersections through third vias penetrating through the interlayer insulation layer.

In some implementations, the first sub-metal line has a line thickness of 2000 Å to 6000 Å, and a line width of 3 μm to 10 μm; and/or the second sub-metal line has a line thickness of 2000 Å to 6000 Å, and a line width of 3 μm to 10 μm.

In some implementations, a material of the second trace includes copper.

In some implementations, the second trace has a thickness of 15 μm to 35 μm, and a line width of 100 μm to 5 mm.

In some implementations, the display module includes a liquid crystal display module.

In some implementations, the display module further includes an opposite substrate disposed opposite to the display substrate; the opposite substrate is provided with a black matrix, and an orthographic projection of the first trace on the first base is located within an orthographic projection of the black matrix on the first base.

BRIEF DESCRIPTION OF DRAWINGS

FIG. 2 is a cross-sectional view taken along A-A' of FIG. 1a.

FIG. 3 is a cross-sectional view taken along B-B' of FIG. 1a.

FIG. 5 is a cross-sectional view taken along C-C' of FIG. 4a.

DETAIL DESCRIPTION OF EMBODIMENTS

To improve understanding of the technical solution of the present disclosure for those skilled in the art, the present disclosure will now be described in detail with the help of accompanying drawings and specific embodiments.

Unless otherwise defined, technical terms or scientific terms used herein should have general meanings that are understood by those of ordinary skill in the technical field of the present disclosure. The words "first", "second" and the like used herein do not denote any order, quantity or importance, but are just used to distinguish between different elements. Similarly, the words "one", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

In an example, a display module typically includes a display panel and a flexible circuit board. The display panel includes a display substrate and an opposite substrate disposed oppositely, and a liquid crystal layer disposed between the display substrate and the opposite substrate. In a case where the display substrate is an array substrate, the opposite substrate is a color filter substrate. In a case where the display substrate is a color on array (COA) substrate, the opposite substrate is a cover plate, on which no color filter is provided. Hereinafter, the illustration is made taking an example where the display substrate is the array substrate, and the opposite substrate is the color filter substrate. The array substrate includes a first base and a plurality of gate lines and a plurality of data lines arranged on the first base intersected with each other, the intersected gate lines and data lines defines a plurality of pixel units of the array substrate, each of the pixel units includes structures such as a pixel driving circuit and a display electrode, which are not enumerated here. The array substrate is divided into a display region, and a fan-out region and a bonding region sequentially located on a side of the display region. The data lines extend through the fan-out region to the bonding region, and are connected to connection pads in the bonding region; and connection pads are formed on the flexible circuit board in one-to-one correspondence with those in the bonding region. In this case, the connection pads on the flexible circuit board are bonded with and connected to the connection pads in the bonding region by an ACF glue. Then, data signals are written into the data lines via a chip. In addition, the gate lines are connected to a gate driving chip, which will not be described in detail herein.

The NFC technology has been generally applied to data exchange on electronic devices, and to utilize the NFC communication technology, a communication antenna needs to be installed on an electronic device to transmit and receive electromagnetic wave signals, and the communication antenna will occupy a large space. Current electronic devices mostly utilize the NFC communication technology by providing an independent NFC communication module external to a mainboard of the electronic device, and thus a large space is occupied, which is unfavorable for a light-weight design of device.

In view of this, an embodiment of the present disclosure provides a display module in which a coil is integrated on the array substrate and the flexible circuit board of the display module, thereby implementing an integrated design of the NFC antenna and the display module, which is beneficial to saving space and realizing a lightweight design of the display module.

The display module according to the embodiment of the present disclosure will be described below with reference to the accompanying drawings and specific implementations.

Figure 1A:
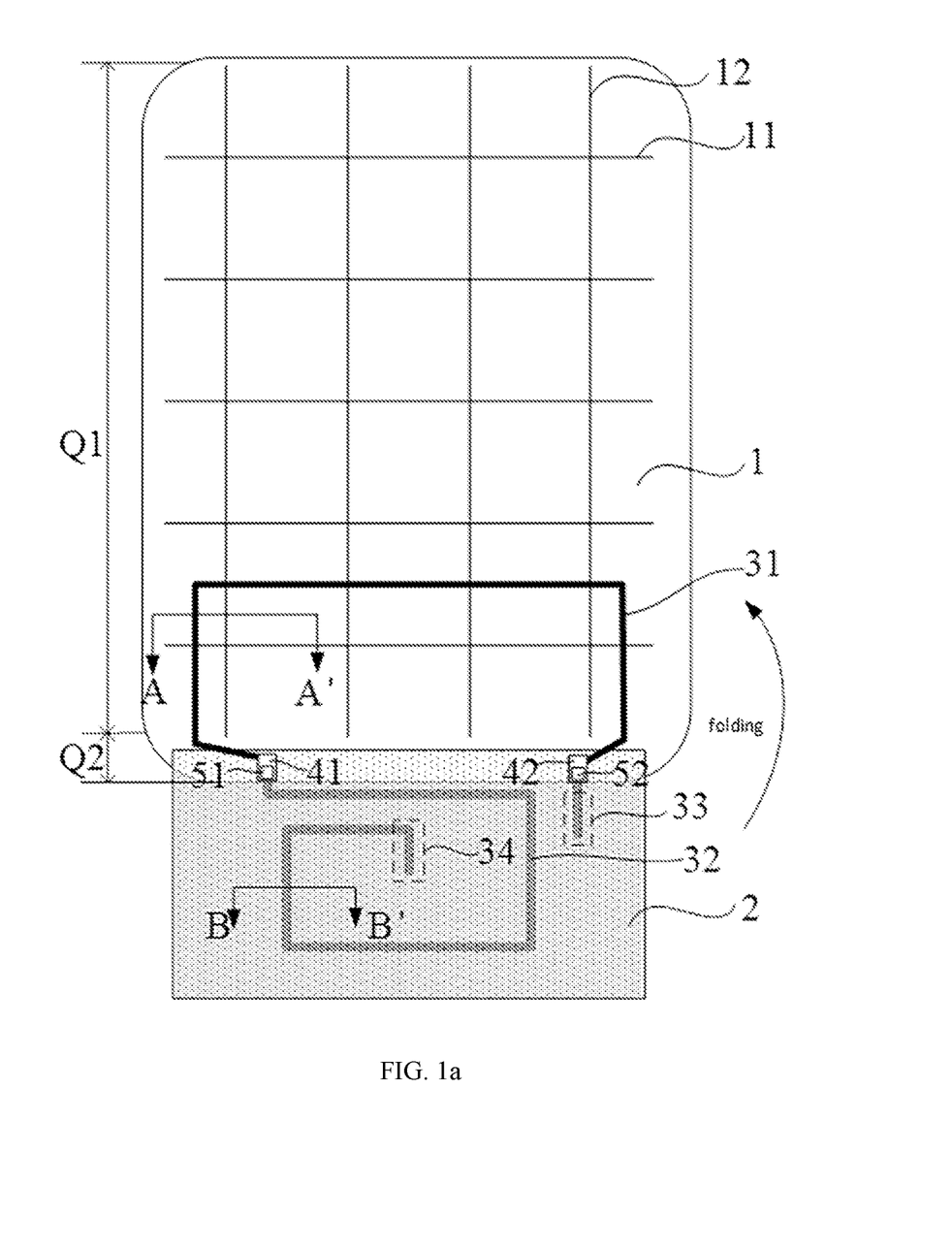
FIG. 1a is a top view of a flexible circuit board of a display module not being folded according to an embodiment of the present disclosure.
Figure 1B:
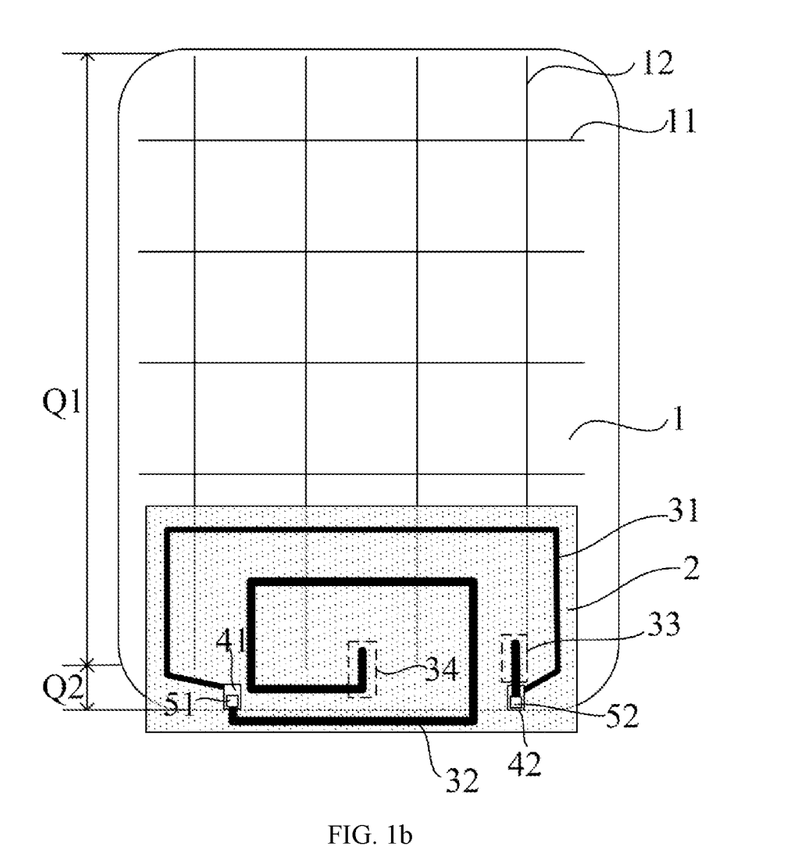
FIG. 1b is a top view of a flexible circuit board of a display module being folded according to an embodiment of the present disclosure.
Figure 2:
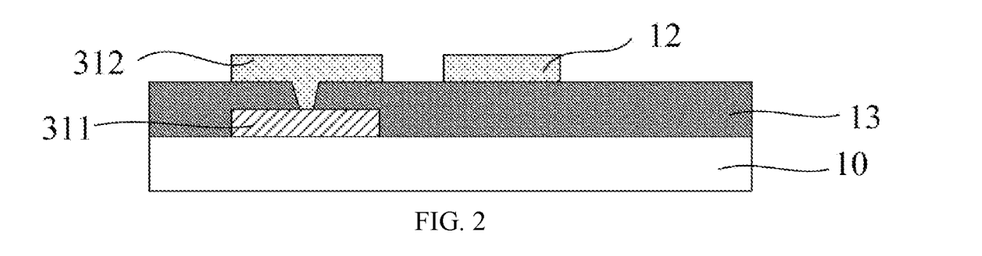
Figure 3:
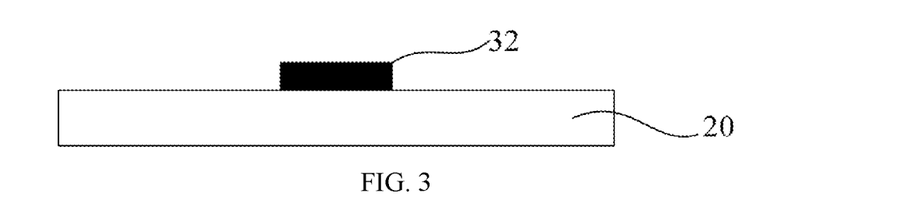

In a first example, FIG. 1a is a top view of the flexible circuit board 2, which is unfolded, of the display module according to an embodiment of the present disclosure. FIG. 1b is a top view of the flexible circuit board 2, which is folded, of the display module according to an embodiment of the present disclosure. FIG. 2 is a cross-sectional view taken along A-A' of FIG. 1a. FIG. 3 is a cross-sectional view taken along B-B' of FIG. 1a. As shown in FIGS. 1a, 1b, 2 and 3, the display module includes an array substrate 1, a flexible circuit board 2, and a near field communication antenna. The array substrate 1 has a display region Q1 and a bonding region Q2, and the array substrate 1 and the flexible circuit board 2 are bonded and connected in the bonding region Q2. The array substrate 1 includes a first base 10; the flexible circuit board 2 includes a second base 20; the near field communication antenna includes a first trace 31, a second trace 32, a first lead terminal 33, and a second lead terminal 34. The first trace 31 of the near field communication antenna is disposed on the first base 10 and extends from the display region Q1 to the bonding region Q2. The second base 20 has a first surface and a second surface disposed oppositely. When the flexible circuit board 2 is folded to a side of the first base 10 away from the first trace 31, the first surface of the second base 20 is closer to the first base 10 than the second surface. The second trace 32 of the near field communication antenna is disposed on the first surface of the second base 20. The first lead terminal 33 and the second lead terminal 34 are both disposed on the second surface of the second base 20. With continued reference to FIG. 1a, a first end of the first trace 31 on the first base 10 is connected to a first end of the second trace 32; a second end of the first trace 31 is connected to the first lead terminal 33; and a second end of the second trace 32 serves as the second lead terminal 34.

In this case, the first lead terminal 33 and the second lead terminal 34 may be connected to a control circuit so that the near field communication antenna and the control circuit form a closed loop, and an induced current loop may be formed in the near field communication antenna and the control circuit through an external magnetic induction coil, thereby completing the near field communication.

In some examples, the first trace 31 and the second trace 32 of the near field communication antenna may form a single turn of coil, or may form multiple turns of coil. FIGS. 1a and 1b take the example of a near field communication antenna including two turns of coil. The first trace 31 on the first base 10 is disposed in a U shape, and includes a first part extending in a first direction, and a second part and a third part extending in a second direction. A first end of the second part and a first end of the third part are respectively connected to a first end and a second end of the first part, and a second end of the second part serves as the first end of the first trace 31, and a second end of the third part serves as the second end of the first trace 31. In some examples, the first part of the first trace line 31 has a length substantially equal to a width of the display region Q1. The second trace 32 on the second base 20 is disposed in a ring shape, and when the flexible circuit board 2 is folded to a side of the first base 10 away from the first trace 31, the first trace 31 and the second trace 32 are connected in series to form the two turns of coil of the near field communication antenna.

In some examples, the first lead terminal 33 and the second lead terminal 34 extend in a same direction, so as to facilitate connection of the near field communication antenna to the control circuit.

In some examples, the bonding region Q2 of the array substrate 1 includes a first connection pad 41 and a second connection pad 42 disposed on the first base 10; the first end of the first trace 31 extends to the bonding region Q2 and is connected to the first connection pad 41, and the second end of the first trace 31 extends to the bonding region Q2 and is connected to the second connection pad 42. The flexible circuit board further includes a third connection pad 51 and a fourth connection pad 52 located on the first surface of the second base 20, the third connection pad 51 is connected to the first end of the second trace 32, and the fourth connection pad 52 is connected to the first lead terminal 33. In this case, the first connection pad 41 is bonded with and connected to the third connection pad 51 by an ACF glue, to realize the connection between the first end of the first trace 31 and the first end of the second trace 32; the second connection pad 42 is bonded with and connected to the fourth connection pad 52 by an ACF glue, to realize the connection between the second end of the first trace 31 and the first lead terminal 33. In some examples, after the first connection pad 41 is bonded with and connected to the third connection pad 51, and the second connection pad 42 is bonded with and connected to the fourth connection pad 52, a UV glue may be further used for securing purposes, thereby ensuring that the first connection pad 41 and the third connection pad 51, and the second connection pad 42 and the fourth connection pad 52 are reliably connected, respectively.

In some examples, the first trace 31 of the near field communication antenna has a metal grid structure. Since most of the structure of the first trace 31 is located in the display region Q1 of the array substrate 1, the first trace 31 having the metal grid structure can reduce an influence on the light transmittance of the display module as much as possible. In an example, the metal grid structure includes a plurality of first sub-metal lines 311 and a plurality of second sub-metal lines 312 which are intersected and electrically connected. An interlayer insulation layer is disposed between a layer where the first sub-metal line 311 is located and a layer where the second sub-metal line 312 is located, and the first sub-metal line 311 and the second sub-metal line 312 are electrically connected at the intersection through a third via penetrating the interlayer insulation layer.

For example, as shown in FIGS. 1a, 1b and 2, the array substrate 1 further includes, in addition to the above structures, a plurality of gate lines 11 and a plurality of data lines 12 disposed on the first base 10. The gate lines 11 extend in the first direction and are arranged side by side in the second direction; and the data lines 12 extend in the second direction and are arranged side by side in the first direction. In this case, the gate lines 11 and the data lines 12 are intersected with each other, and pixel units are defined at the intersections of the gate lines 11 and the data lines 12, each pixel unit including at least a thin film transistor and a display electrode (e.g., a pixel electrode). A gate of the thin film transistor is connected to one of the gate lines, a source of the thin film transistor is connected to one of the data lines 12, and a drain of the thin film transistor is connected to the display electrode. For example, the array substrate 1 includes a first metal layer, an interlayer insulation layer, and a second metal layer sequentially disposed on the first base 10. The first metal layer includes the plurality of gate lines 11, gates of thin film transistors, and first sub-metal lines 311 of the metal grid structure, and the first sub-metal lines 311 and the gate lines 11 are spaced apart from each other. The second metal layer includes the plurality of data lines 12, sources and drains of the thin film transistors, and second sub-metal lines of the metal grid structure. In this case, the first sub-metal line 311 and the second sub-metal line are electrically connected at the intersection through a third via penetrating the interlayer insulation layer. That is, in the embodiment of the present disclosure, the first trace 31 may be formed while the gate lines 11 and the data lines 12 are formed, and thus, the process steps are not increased. In addition, since the first trace 31 adopts the metal grid structure, the first sub-metal lines 311 and the gate lines 11 are disposed in a same layer, and the second sub-metal lines 312 and the data lines 12 are disposed in a same layer, a thickness of the array substrate 1 will not be increased.

It should be noted that, when the first trace 31 includes the first sub-metal lines 311 and the second sub-metal lines 312 which are intersected with each other, the first sub-metal lines 311 and the second sub-metal lines 312 at the first end of the first trace 31 are short-circuited together and then connected to the first connection pad 41. Likewise, the first sub-metal lines 311 and the second sub-metal lines 312 at the second end of the first trace 31 are short-circuited together and then connected to the second connection pad 42.

In some examples, the first sub-metal line 311 of the metal grid structure has a line thickness of 2000 Å to 6000 Å, and a line width of 3 μm to 10 μm; and/or the second sub-metal line 312 has a line thickness of 2000 Å to 6000 Å, and a line width of 3 μm to 10 μm. For example, the first sub-metal line 311 and the second sub-metal line 312 have a same line thickness and a same line width. The first metal layer and the second metal layer are formed of a material including, but not limited to, at least one of molybdenum, molybdenum-niobium alloy, aluminum-neodymium alloy, titanium or copper.

In some examples, the second trace 32 in the flexible circuit board 2 is formed of a material including, but not limited to, copper. The copper material is selected due to better conductivity and smaller impedance thereof. In some examples, the second trace 32 has a thickness of about 15 μm to 35 μm, and a line width of about 100 μm to 5 mm.

In some examples, in order to prevent that a distance between the second trace 32 and a rear case of the display module is too small after the flexible circuit board 2 is folded to affect the performance of the near field communication antenna, a magnetic material layer is disposed on a side of the second trace 32 away from the second surface. In the embodiment of the present disclosure, the magnetic material layer is provided to enhance a magnetic flux of the near field communication antenna. In some examples, the magnetic material layer is made of a material including, but not limited to, a magnetic material such as ferrite.

Figure 4A:
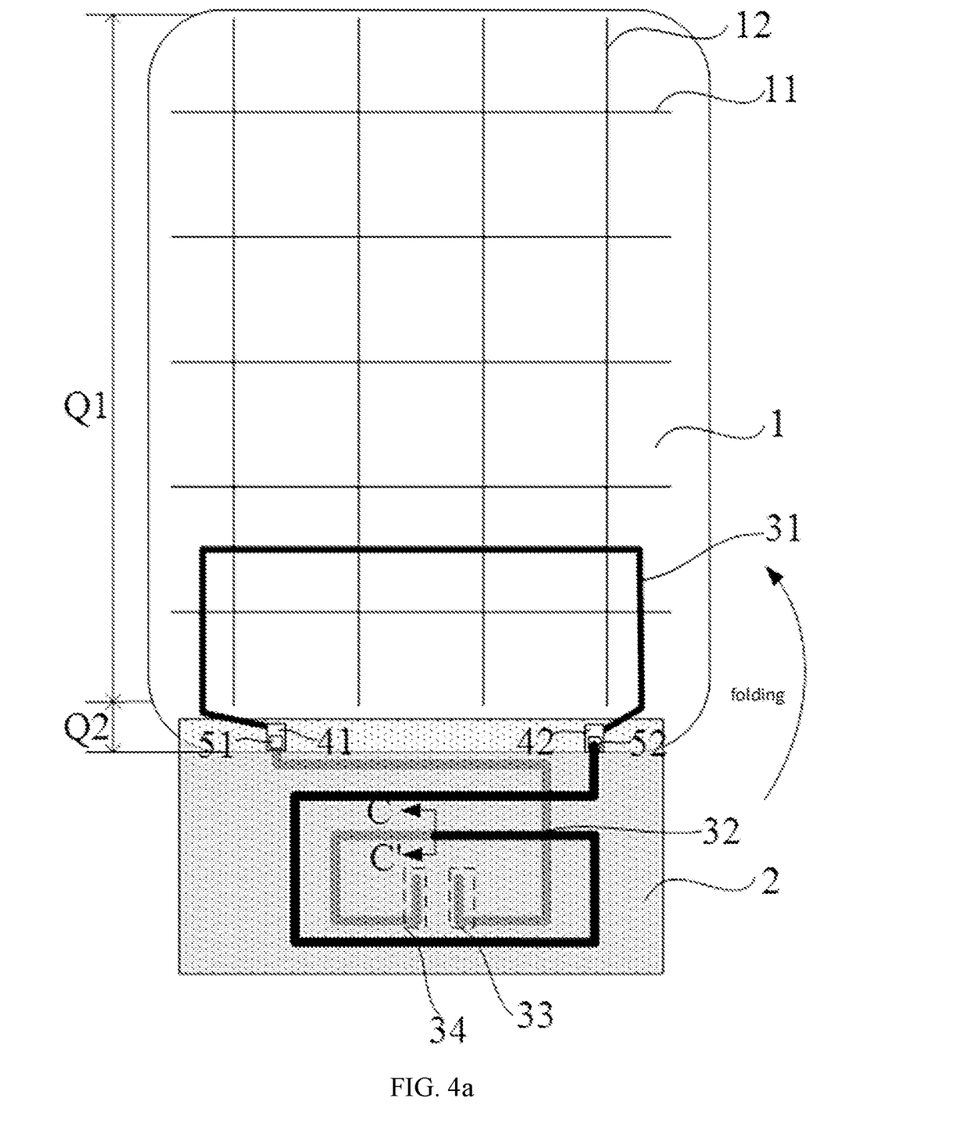
FIG. 4a is a top view of a flexible circuit board of another display module not being folded according to an embodiment of the present disclosure.
Figure 4B:
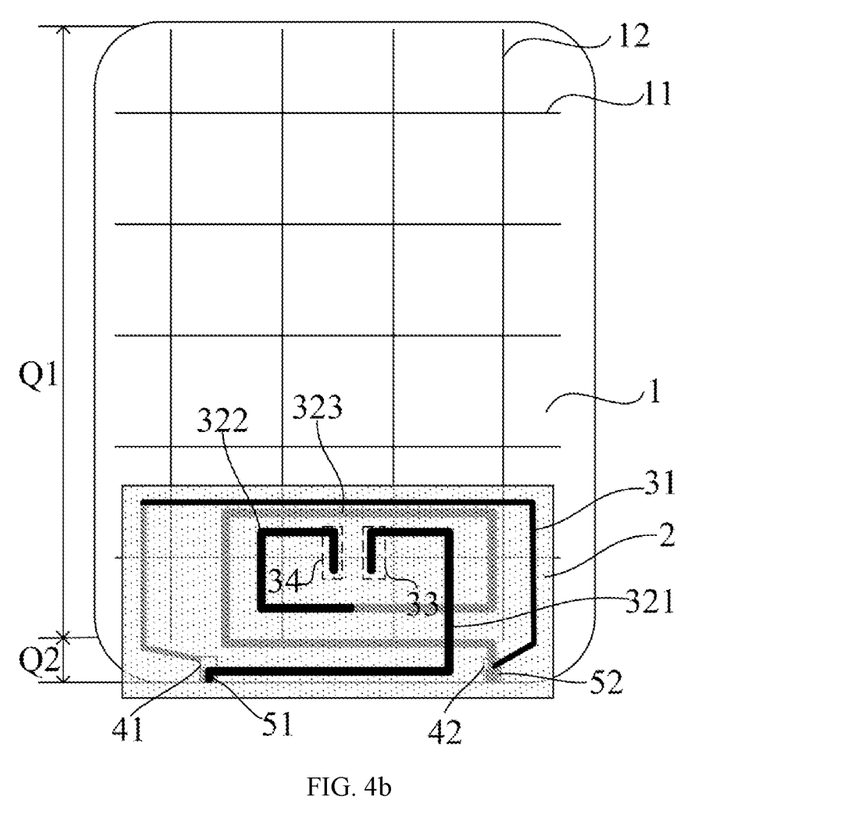
FIG. 4b is a top view of a flexible circuit board of another display module being folded according to an embodiment of the present disclosure.

In a second example, the display module has substantially the same structure as that in the first example, except that the second trace 32 of the near field communication antenna in the display module is different. FIG. 4a is a top view of a flexible circuit board 2, which is unfolded, of another display module according to an embodiment of the present disclosure; FIG. 4b is a top view of a flexible circuit board 2, which is folded, of another display module according to an embodiment of the present disclosure; and FIG. 5 is a cross-sectional view taken along C-C' of FIG. 4a.

Figure 5:
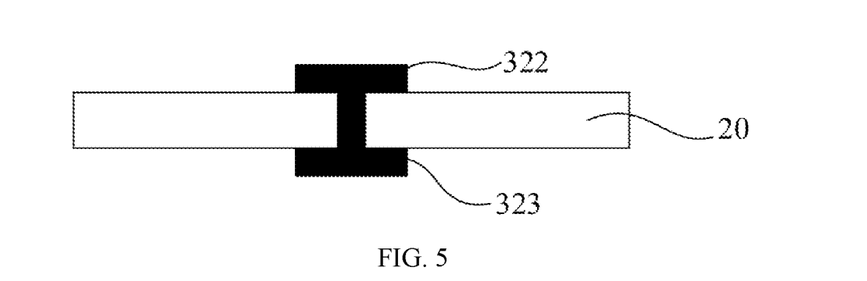

As shown in FIGS. 4a, 4b and 5, the second trace 32 of the near field communication antenna includes a first sub-trace segment 321, a second sub-trace segment 322 and a third sub-trace segment 323. The first sub-trace segment 321 and the second sub-trace segment 322 are located on the first surface of the second base 20, and the third sub-trace segment 323 is located on the second surface of the second base 20. A first end of the first sub-trace segment 321 serves as the first end of the second trace 32, and a second end of the first sub-trace segment 321 serves as the first lead terminal 33; and a second end of the second sub-trace segment 322 serves as the second lead terminal 34. In this case, a first end of the first trace 31 of the near field communication antenna is connected to the first end of the first sub-trace segment 321; a second end of the first trace 31 is connected to a first end of the third sub-trace segment 323 through a first via penetrating through the second base 20; and a second end of the third sub-trace segment 323 is connected to a first end of the second sub-trace segment 322 through a second via penetrating through the second base 20.

In the embodiment of the present disclosure, since the near field communication antenna is integrated in the display region Q1 of the array substrate 1 and the flexible circuit board 2 of the display module, an integrated design of the near field communication antenna and the display module is achieved and no separate near field communication antenna is needed, thereby effectively saving the space occupied by the near field communication antenna, and facilitating a lightweight design of the display module. Moreover, in the embodiment of the present disclosure, by integrating part of the traces of the near field communication antenna on the first surface and the second surface of the flexible circuit board 2, an area of the display region Q1 of the array substrate 1 occupied by the near field communication antenna can be effectively reduced, and a high resolution and high aperture ratio design of the array substrate 1 is facilitated. In addition, the flexible circuit board 2 typically includes a single-layer trace, which means that the driving chip and the signal lines are all disposed on the first surface of the second base 20 of the flexible circuit board 2, and there is generally no wiring on the second surface of the second base 20, that is, there is enough space on the second surface of the second base 20 to form a coil structure. Therefore, in the embodiment of the present disclosure, a part of the traces (the third sub-trace segment 323) of the near field communication antenna is disposed on the second surface of the second base 20, which may effectively prevent interference between the traces of the near field communication antenna and the signal lines, the driving chip, or the like on the flexible circuit board 2.

It should be noted that, in the near field communication antenna shown in FIG. 4a, the structure of the first trace 31 is the same as the structure of the first trace 31 described above, and therefore, the structure and parameters of the first trace 31 are not repeated here.

In some examples, the first sub-trace segment 321, the second sub-trace segment 322 and the third sub-trace segment 323 of the second trace 32 have the same line width and the same thickness, which are the same as the line width and thickness of the second trace 32 shown in FIG. 1a, and thus are not repeated here.

In some examples, the first trace 31, the first sub-trace segment 321, the second sub-trace segment 322, and the third sub-trace segment 323 of the near field communication antenna may form a single turn of coil, or may form multiple turns of coil. As shown in FIG. 4b, in an implementation of the present disclosure, a near field communication antenna in which the flexible circuit board 2 is folded to form three turns of coil is taken as an example. The first trace 31 has a U shape, which is the same as that shown in FIG. 1b and thus is not repeated here. An orthographic projection of the third sub-trace segment 323 on the second base 20 encloses into a coil structure, orthographic projections of the first sub-trace segment 321 and the third sub-trace segment 323 on the second base 20 enclose into a coil structure, and when the flexible circuit board 2 is folded, the first trace 31, the first sub-trace segment 321, the second sub-trace segment 322 and the third sub-trace segment 323 form three turns of coil. Certainly, the first trace 31, the first sub-trace segment 321, the second sub-trace segment 322, and the third sub-trace segment 323 may be wound to form a near field communication antenna 3 having more turns of coil, which are not enumerated here.

In some examples, when the flexible circuit board 2 is folded to a side of the first base 10 away from the first trace 31, orthographic projections of the first sub-trace segment 321, the second sub-trace segment 322 and the third sub-trace segment 323 of the near field communication antenna on the first base 10 are located within a range defined by an orthographic projection of the first trace 31 on the first base 10. For example, referring to FIG. 4b, if the first trace 31 is arranged in the U shape, orthographic projections of the first sub-trace segment 321, the second sub-trace segment 322 and the third sub-trace segment 323 on the first base 10 are located in an orthographic projection of the U-shaped first trace on the first base 10. That is, the first trace 31, the first sub-trace segment 321, the second sub-trace segment 322 and the third sub-trace segment 323 are arranged in series to form three turns of coil sequentially nested.

In some examples, when the flexible circuit board 2 is folded to the side of the first base 10 away from the first trace 31, orthographic projections of the first sub-trace segment 321 and the second sub-trace segment 322 of the near field communication antenna on the second base 20 are located on an orthographic projection of the third sub-trace segment 323 on the second base 20. In this case, more turns of coil can be formed in a limited wiring space, so as to enhance communication performance of the near field communication antenna. For example, orthographic projections of a second coil and a third coil of the near field communication antenna on the second base 20 coincides.

In some examples, in the near field communication antenna of the embodiment of the present disclosure, a magnetic material layer is disposed on a side of the first sub-trace segment 321 and the second sub-trace segment 322 away from the first surface; and/or a magnetic material layer is disposed on a side of the third sub-trace segment 323 away from the second surface. For example, in addition to the above structures, the display module further includes a rear case fixed to a side of the flexible circuit board 2 away from the array substrate 1. When the flexible circuit board 2 is folded to a side of the first base 10 away from the first trace 31, and a distance between the flexible circuit board 2 and the array substrate 1 is less than a preset value, a magnetic material layer is disposed on the side of the first sub-trace segment 321 and the second sub-trace segment 322 away from the first surface; and when a distance between the flexible circuit board 2 and the rear case is less than a preset value, a magnetic material layer is disposed on the side of the third sub-trace segment 323 away from the second surface. In an embodiment of the present disclosure, the magnetic material layer is provided to enhance a magnetic flux of the near field communication antenna. In some examples, the magnetic material layer is made of a material including, but not limited to, a magnetic material such as ferrite.

In some examples, the array substrate 1 in the embodiment of the present disclosure further includes, in addition to the above structures, a first connection pad 41 and a second connection pad 42 located in the bonding region Q2 and disposed on the first base 10; and the flexible circuit board 2 in the embodiment of the present disclosure further includes, in addition to the above structures, a third connection pad and a fourth connection pad located on the first surface of the second base 20. The first end of the first trace 31 of the near field communication antenna is connected to the first connection pad 41, and the second end of the first trace 31 is electrically connected to the second connection pad. The third connection pad 51 on the flexible circuit board 2 is connected to a second end of the first sub-trace segment 321, and the fourth connection pad 52 on the flexible circuit board 2 is connected to a first end of the third sub-trace segment 323 through a first via penetrating through the second base 20. The first connection pad 41 is bonded with and connected to the third connection pad 51, such as by an ACF glue, to implement the connection between the first end of the first trace 31 and the first end of the first sub-trace segment 321. The second connection pad 42 is bonded with and connected to the fourth connection pad 52, such as by an ACF glue, to implement the connection between the second end of the first trace 31 and the first end of the third sub-trace segment 323. Certainly, after the first connection pad 41 is bonded with and connected to the third connection pad 51, and the second connection pad 42 is bonded with and connected to the fourth connection pad 52, a UV glue may be further used for securing purposes, thereby ensuring that the first connection pad 41 and the third connection pad 51, and the second connection pad 42 and the fourth connection pad 52 are reliably connected respectively. It should be noted that, when the first trace 31 adopts a metal grid structure, the first sub-metal lines 311 and the second sub-metal lines 312 at the first end and the second end of the metal grid need to be combined and connected to each other, and then connected to the first connection pad 41 and the second connection pad 42, respectively.

In some examples, the display module in the embodiments of the present disclosure may be used in a liquid crystal display module, or may also be used in an organic light-emitting diode (OLED) display module. The embodiments of the present disclosure takes the display substrate used in a liquid crystal display panel as an example to illustrate the setting manner of the metal grid structure. The display module includes the array substrate 1 as described above, and further includes a color filter substrate on which a black matrix BM is disposed. Orthographic projections of the gate lines 11, the data lines 12 and the metal lines of the metal grid structure on the first base 10 are each located within an orthographic projection range of the black matrix BM on the first base thereby avoiding light leakage.

The display module may be a liquid crystal display panel, an OLED panel, a mobile phone, a tablet, a digital photo frame, a navigator or any other product or device having a display function and a communication function.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A display module, comprising a display substrate, a flexible circuit board, and a near field communication antenna; wherein the display substrate has a display region and a bonding region; the flexible circuit board is bonded with and connected to the display substrate in the bonding region; and wherein at least part of a structure of the near field communication antenna is disposed in the display region of the display substrate and the flexible circuit board, wherein the display substrate comprises a first base; the flexible circuit board comprises a second base; the near field communication antenna comprises a first trace and a second trace electrically connected, the first trace is disposed on the first base and extends from the display region to the bonding region, and the second trace is located on the second base.

2. The display module according to claim 1, wherein the second base comprises a first surface and a second surface disposed oppositely; the second trace is disposed on the first surface; and the near field communication antenna further comprises a first lead terminal and a second lead terminal disposed on the flexible circuit board; and a first end of the first trace is connected to a first end of the second trace; a second end of the first trace is connected to the first lead terminal; and a second end of the second trace serves as the second lead terminal.

3. The display module according to claim 2, wherein the display substrate further comprises a first connection pad and a second connection pad located in the bonding region and disposed on the first base; and a third connection pad and a fourth connection pad are disposed on the first surface of the second base;

the first connection pad is bonded with and connected to the third connection pad so that the first end of the first trace is electrically connected to the first end of the second trace; and the second connection pad is bonded with and connected to the fourth connection pad so that the second end of the first trace is electrically connected to the first lead terminal.

4. The display module according to claim 2, wherein a magnetic material layer is disposed on a side of the second trace away from the first surface; and the magnetic material layer covers the second trace.

5. The display module according to claim 2, wherein the first lead terminal and the second lead terminal extend in a same direction.

6. The display module according to claim 1, wherein the second base comprises a first surface and a second surface disposed oppositely; the second trace comprises a first sub-trace segment and a second sub-trace located on the first surface, and a third sub-trace segment located on the second surface; and the near field communication antenna further comprises a first lead terminal and a second lead terminal disposed on the flexible circuit board; and a first end of the first trace is connected to a first end of the first sub-trace segment; a second end of the first trace is connected to a first end of the third sub-trace segment through a first via penetrating through the second base; a second end of the third sub-trace segment is connected to a first end of the second sub-trace segment through a second via penetrating through the second base; a second end of the first sub-trace segment serves as the first lead terminal; and a second end of the second sub-trace segment serves as the second lead terminal.

7. The display module according to claim 6, wherein the display substrate further comprises a first connection pad and a second connection pad located in the bonding region and disposed on the first base; and a third connection pad and a fourth connection pad are disposed on the first surface of the second base;

the first connection pad is bonded with and connected to the third connection pad so that the first end of the first trace is electrically connected to the first end of the first sub-trace segment; and the second connection pad is bonded with and connected to the fourth connection pad so that the second end of the first trace is electrically connected to the first end of the third sub-trace segment through the first via.

8. The display module according to claim 7, wherein orthographic projections of the first sub-trace segment and the second sub-trace segment on the second base overlap an orthographic projection of the third sub-trace segment on the second base.

9. The display module according to claim 7, wherein when the second base is disposed opposite to the first base, orthographic projections of the first sub-trace segment, the second sub-trace segment and the third sub-trace segment on the first base are located within a range defined by an orthographic projection of the first trace on the first base.

10. The display module according to claim 6, wherein orthographic projections of the first sub-trace segment and the second sub-trace segment on the second base overlap an orthographic projection of the third sub-trace segment on the second base.

11. The display module according to claim 6, wherein when the second base is disposed opposite to the first base, orthographic projections of the first sub-trace segment, the second sub-trace segment and the third sub-trace segment on the first base are located within a range defined by an orthographic projection of the first trace on the first base.

12. The display module according to claim 6, wherein a magnetic material layer is disposed on a side of the first sub-trace segment and the second sub-trace segment away from the first surface; and the magnetic material layer covers the first sub-trace segment and the second sub-trace segment; and/or, a magnetic material layer is disposed on a side of the third sub-trace segment away from the first surface; and the magnetic material layer covers the third sub-trace segment.

13. The display module according to claim 1, wherein a material of the second trace comprises copper.

14. The display module according to claim 1, wherein the second trace has a thickness of 15 μm to 35 μm, and a line width of 100 μm to 5 mm.

15. The display module according to claim 1, wherein the first trace has a metal grid structure.

16. The display module according to claim 15, wherein the metal grid structure comprises a plurality of first sub-metal lines and a plurality of second sub-metal lines which are intersected and electrically connected with each other; and the display substrate further comprises a first metal layer and a second metal layer located on the first base, and an interlayer insulation layer located between the first metal layer and the second metal layer;

the first metal layer comprises a plurality of gate lines and the plurality of first sub-metal lines, and each of the plurality of gate lines and each of the plurality of first sub-metal lines are spaced apart from each other;

the second metal layer comprises a plurality of data lines and the plurality of second sub-metal lines, and each of the plurality of data lines and each of the plurality of second sub-metal lines are spaced apart from each other; and the first sub-metal lines and the second sub-metal lines are electrically connected at the intersections through third vias penetrating through the interlayer insulation layer.

17. The display module according to claim 16, wherein the first sub-metal line has a line thickness of 2000 Å to 6000 Å, and a line width of 3 μm to 10 μm; and/or the second sub-metal line has a line thickness of 2000 Å to 6000 Å, and a line width of 3 μm to 10 μm.

18. The display module according to claim 1, wherein the display module comprises a liquid crystal display module.

19. The display module according to claim 18, wherein the display module further comprises an opposite substrate disposed opposite to the display substrate; the opposite substrate is provided with a black matrix thereon, and an orthographic projection of the first trace on the first base is located within an orthographic projection of the black matrix on the first base.

* * * * *